United States Patent
Na et al.

(10) Patent No.: US 10,204,420 B2
(45) Date of Patent: Feb. 12, 2019

(54) LOW LATENCY SIMULATION APPARATUS AND METHOD USING DIRECTION PREDICTION, AND COMPUTER PROGRAM THEREFOR

(71) Applicant: FXGEAR INC., Seoul (KR)

(72) Inventors: Kyung Kun Na, Seoul (KR); Kwang Jin Choi, Seoul (KR)

(73) Assignee: FXGEAR INC., Seoul (KR)

( * ) Notice: Subject to any disclaimer, the term of this patent is extended or adjusted under 35 U.S.C. 154(b) by 3 days.

(21) Appl. No.: 15/512,833

(22) PCT Filed: Sep. 22, 2015

(86) PCT No.: PCT/KR2015/009934
§ 371 (c)(1),
(2) Date: Mar. 20, 2017

(87) PCT Pub. No.: WO2016/047999
PCT Pub. Date: Mar. 31, 2016

(65) Prior Publication Data
US 2017/0294022 A1  Oct. 12, 2017

(30) Foreign Application Priority Data
Sep. 22, 2014  (KR) .......................... 10-2014-0125850

(51) Int. Cl.
*G06T 7/20* (2017.01)
*G06F 19/00* (2018.01)
(Continued)

(52) U.S. Cl.
CPC ............ *G06T 7/20* (2013.01); *G06F 17/5009* (2013.01); *G06F 19/00* (2013.01); *G06T 3/20* (2013.01); *G06T 15/00* (2013.01); *G06T 2200/16* (2013.01)

(58) Field of Classification Search
CPC ............................. G06T 7/20; G06F 17/5009
See application file for complete search history.

(56) References Cited

U.S. PATENT DOCUMENTS 6,995,793 B1  2/2006  Albadawi et al.
8,408,982 B2  4/2013  Marty et al.
(Continued)

FOREIGN PATENT DOCUMENTS

JP  2001-075470 A  3/2001
JP  2002-525769 A  8/2002
(Continued)

OTHER PUBLICATIONS

PCT International Search Report, PCT/KR2015/009934, dated Feb. 22, 2016, 5 Pages.
(Continued)

*Primary Examiner* — Ryan R Yang
(74) *Attorney, Agent, or Firm* — Fenwick & West LLP

(57) ABSTRACT

A simulation apparatus may comprise: a sensor unit configured to acquire movement information of an object using one or more sensors; a direction calculation unit configured to calculate direction information of the object using the movement information; and a simulation unit configured to simulate a physical object and render an image of the physical object on the basis of the direction information received from the direction calculation unit. The direction calculation unit may include a time delay correction unit configured to correct the direction information using a time difference between the time of acquiring the movement information and the time of rendering the image.

7 Claims, 1 Drawing Sheet

(51) Int. Cl.
*G06F 17/50* (2006.01)
*G06T 3/20* (2006.01)
*G06T 15/00* (2011.01)

(56) References Cited

U.S. PATENT DOCUMENTS

| | | | |
|---|---|---|---|
| 9,643,081 B1 * | 5/2017 | Kavars | A63F 13/211 |
| 2006/0223637 A1 * | 10/2006 | Rosenberg | A63F 13/10 |
| | | | 463/47 |
| 2011/0300933 A1 | 12/2011 | Chien et al. | |
| 2012/0289296 A1 | 11/2012 | Marty et al. | |
| 2013/0172058 A1 | 7/2013 | Marty et al. | |
| 2016/0027141 A1 * | 1/2016 | Patel | G06T 1/20 |
| | | | 345/522 |

FOREIGN PATENT DOCUMENTS

| | | |
|---|---|---|
| JP | 2002-354880 A | 12/2002 |
| KR | 10-2000-0066931 A | 11/2000 |
| KR | 10-2012-0076885 A | 7/2012 |

OTHER PUBLICATIONS

Ohshima, T. et al., "AR2 Hockey System: A Collaborative Mixed Reality System," *The Virtual Reality Society of Japan*, 1998, pp. 55-60, vol. 3, No. 2 [with abstract in English].

* cited by examiner

[FIG. 1]
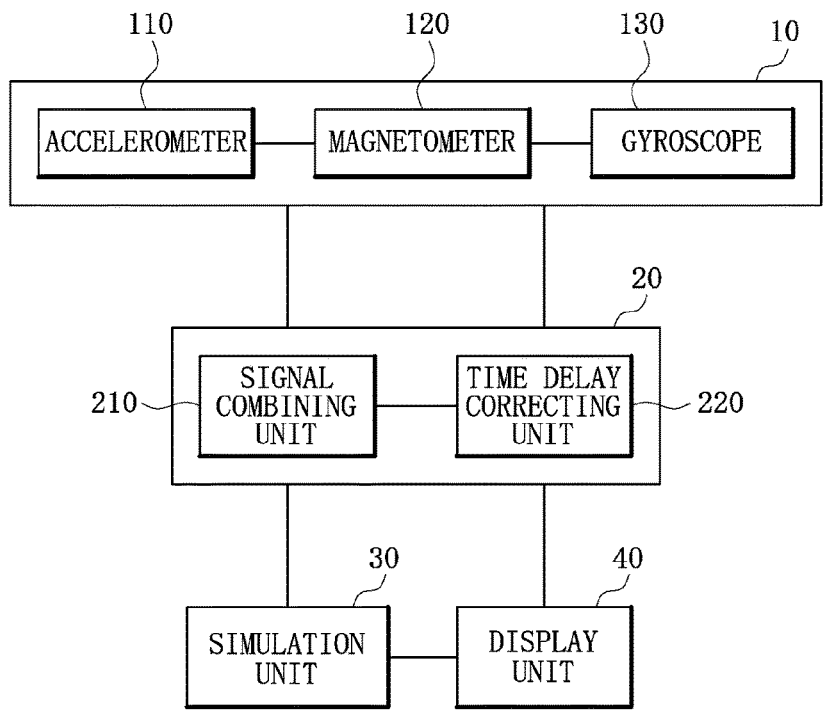
[FIG. 2]
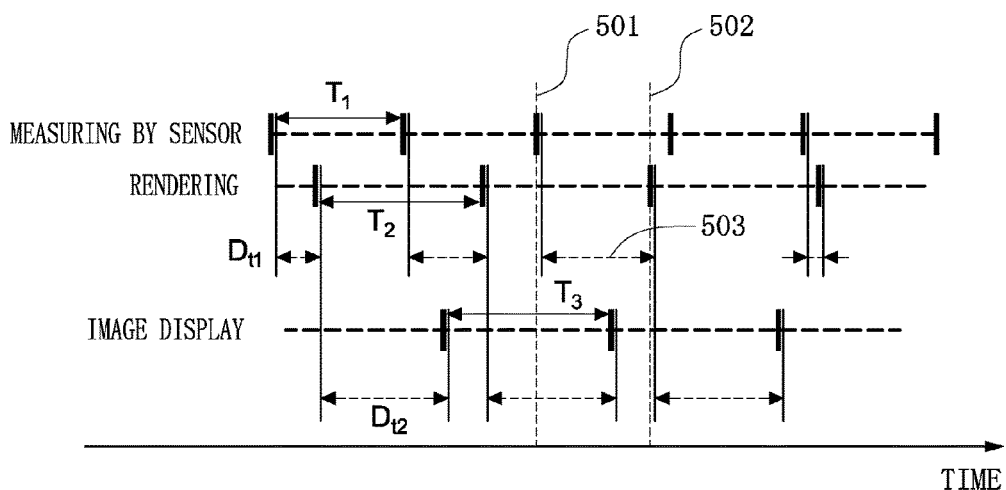

LOW LATENCY SIMULATION APPARATUS AND METHOD USING DIRECTION PREDICTION, AND COMPUTER PROGRAM THEREFOR

TECHNICAL FIELD

Embodiments relate to an apparatus and method for simulation and a computer program for the same, and more particularly, to a simulation technique having low latency by correcting a time difference between a signal measured by a sensor and an image displayed.

BACKGROUND ART

Recently, as the processing capability of a mobile device such as a smartphone is greatly improved, computer simulations are more frequently performed on the mobile device. A simulated object is converted into an image by means of rendering, and is then used in an application such as a game or is displayed on the mobile device to constitute a portion of a user interface associated with the operating system of the mobile device.

In a type of the simulation on the mobile device, a model which is a virtual object is simulated by reflecting a motion of a target and then the simulation result is rendered into an image. The motion of the target which forms a basis of the simulation may be measured using at least one sensor, and the model is simulated according to data of the sensor to replicate the motion of the target or move the model accordingly.

However, a measurement period by the sensor and a period of rendering the simulated model into an image may be asynchronous, which causes latency. In other words, a time delay is generated at an image which is rendered by the comparison with the sensor data of the mobile device and then displayed. This time delay may give embarrassment when a user observes the image, or may give inconvenience to the user when interacting with the image.

DISCLOSURE

Technical Problem

An aspect of this disclosure is directed to providing an apparatus and method for simulation, which has low latency by correcting a time delay between a signal measured by a sensor and an image displayed, and a computer program for the same.

Technical Solution

According to an embodiment, an apparatus for simulation may include: a sensor unit configured to acquire motion information of a target by using at least one sensor; a direction calculating unit configured to calculate direction information of the target by using the motion information; and a simulation unit configured to simulate a physical object and render into an image on the basis of the direction information received from the direction calculating unit. The direction calculating unit may include a time delay correcting unit configured to correct the direction information by using a time difference between an acquisition time of the motion information and a rendering time.

The sensor unit may be configured to periodically acquire the motion information, the simulation unit may be configured to periodically render the image, and the time delay correcting unit may be configured to calculate a time delay from each acquisition time of the motion information to a following rendering time and correct the direction information by using the time delay. In addition, the time delay correcting unit may be configured to correct the direction information by calculating an angular velocity of the target from the motion information and adding a product of the angular velocity and the time delay to the direction information.

The direction calculating unit may be configured to correct the direction information of the target by further using a time difference between the rendering time and a time when the image is displayed at a display unit. The simulation unit may be configured to periodically render the image, and the display unit may be configured to periodically display the image. At this time, the time delay correcting unit may be configured to correct the direction information by further using a time delay from each rendering time till a following image display time.

According to an embodiment, a method for simulation may include: acquiring by a simulation apparatus, motion information of a target by using at least one sensor; calculating, by the simulation apparatus, direction information of the target by using the motion information; correcting, by the simulation apparatus, the direction information by using a time difference between an acquisition time of the motion information and a rendering time; and simulating, by the simulation apparatus, a physical object and rendering into an image on the basis of the corrected direction information.

The acquiring of motion information and the rendering of the image may be periodically performed. At this time, the correcting of the direction information may include: calculating a time delay from each acquisition time of the motion information to a following rendering time; and correcting the direction information by using the time delay. In addition, the correcting of the direction information by using the time delay may include: calculating an angular velocity of the target from the motion information; and correcting the direction information by adding a product of the angular velocity and the time delay to the direction information.

The method for simulation may further include displaying the image at a display unit. At this time, the correcting of the direction information may be performed by further using a time difference between the rendering time and a time when the image is displayed. In addition, the rendering of the image and the displaying of the image at a display unit may be periodically performed, and the correcting of the direction information may be performed by further using a time delay from each rendering time till a following image display time.

A computer program according to an embodiment may be recorded on a medium to execute the simulation method in association with hardware.

Advantageous Effects

The apparatus and method for simulation according to an aspect of the present disclosure performs simulation using direction information, which is predicted in consideration of a time delay between a measurement period of a sensor and a rendering period of an image and/or a time delay from the rendering of the image till the image is actually displayed. As a result, latency between the motion of the target and the displayed image is reduced, and a natural simulation result may be obtained.

BRIEF DESCRIPTION OF DRAWINGS

FIG. 1 is a schematic block diagram showing an apparatus for simulation according to an embodiment.

FIG. 2 is a diagram for illustrating time differences among an acquisition time of motion information, a rendering time and an image display time in a simulation method according to an embodiment.

MODE FOR INVENTION

Hereinafter, embodiments of the present disclosure will be described in detail with reference to the accompanying drawings.

A simulation apparatus according to embodiments is configured to simulate a model according to a motion of a target and render the simulated model into an image. In the specification, the target means a device or human whose motion is to be measured. For example, the target may be a mobile device such as a smartphone owned by a user, or a wearable device such as a head mounted device (HMD) which a user may wear. In addition, the user may serve as a target directly, and a motion of the user may be measured using at least one sensor attached to the user or located remotely.

In the specification, the model means data corresponding to a virtual physical object which is to be simulated by reflecting a motion of the target. For example, the model may be a mesh defined including at least one vertex. By measuring a motion of the target and calculating an interaction according to the motion by means of a physical equation to reflect a location and velocity of each portion of the model, the model may be simulated according to the motion of the target. For example, if the user tilts a mobile device, an image displayed on the mobile device may also be tilted correspondingly. Further, if the user moves in front of a sensor, a character resembling the user may move in the same way as the user.

FIG. 1 is a schematic block diagram showing a simulation apparatus according to an embodiment.

Referring to FIG. 1, a simulation apparatus may include a sensor unit 10, a direction calculating unit 20 and a simulation unit 30. In an embodiment, the simulation apparatus may further include a display unit 40. The simulation apparatus according to embodiments may be entirely hardware, entirely software, or partially hardware and partially software. For example, the simulation apparatus may commonly call hardware having data processing capability and software operating the hardware. In the specification, the term "unit", "system", "device" or the like is intended to indicate a combination of hardware and software driven by the corresponding hardware. For example, the hardware may be a data processing device including a CPU and another processor. In addition, the software driven by the hardware may indicate a process, an object, an executable file, a thread of execution, a program or the like.

Each unit of the simulation apparatus according to embodiments is not intended to always indicate a physically distinct component. In FIG. 1, even though the sensor unit 10, the direction calculating unit 20, the simulation unit 30 and the display unit 40 are depicted as distinguished blocks, depending on embodiments, a part of, or the entirety of, the sensor unit 10, the direction calculating unit 20, the simulation unit 30 and the display unit 40 may be integrated in a single device. In addition, the direction calculating unit 20 and the simulation unit 30 are just designed to functionally distinguish a device according to operations executed in a computing device and do not mean elements which are always separated from each other.

For example, the simulation apparatus according to embodiments may be implemented to be integrated in a mobile device such as a smartphone, where the mobile device is used as a target to measure a motion of the mobile device, and also a predetermined model is simulated according to the measured motion, so that the simulated image is displayed on a screen of the mobile device. However, this is just an example, and in another embodiment, at least one of the sensor unit 10, the direction calculating unit 20, the simulation unit 30 and the display unit 40 may also be implemented as a separate device physically distinguished from other units. For example, the sensor unit 10, the direction calculating unit 20, the simulation unit 30 and the display unit 40 may be components communicatively connected to each other under a distributed computing environment.

The sensor unit 10 is a portion for acquiring motion information of a target. The motion information serves as a base for calculating direction information of the target, and the sensor unit 10 may include a single sensor or a plurality of sensors, configured to obtain sensor data by which the direction information may be calculated. For example, in an embodiment, the sensor unit 10 includes an accelerometer 110, a magnetometer 120 and a gyroscope 130, without being limited thereto. The type of motion information obtained by the sensor unit 10 may vary depending on the kind of sensor. For example, the obtained motion information may be a gravity vector if the accelerometer 110 is used, a direction relatively to magnetic north if the magnetometer 120 is used, or an angular velocity if the gyroscope 130 is used.

The direction calculating unit 20 is a portion for receiving the motion information measured by the sensor unit 10 and calculating direction information of the target therefrom. In an embodiment, the direction calculating unit 20 may include a signal combining unit 210 and a time delay correcting unit 220. The signal combining unit 210 combines motion information measured by each sensor of the sensor unit 10 and calculates direction information therefrom. In an embodiment, the signal combining unit 210 first combines motion information of the accelerometer 110 and the magnetometer 120 to calculate first direction information, and then calculate second direction information by using motion information of the gyroscope 130. In this case, the first direction information depends on a magnetic direction and acceleration and thus includes noise while there is less drift, but the second direction information includes a drift while there is almost no noise. The signal combining unit 210 may calculate combined direction information by combining the first and second direction information according to Equation 1 below.

$$\theta_{fusion} = \alpha \theta_g + (1-\alpha)\theta_{am}$$ [Equation 1]

In Equation 1, $\theta_{am}$ represents first direction information, $\theta_g$ represents second direction information, and $\theta_{fusion}$ represents combined direction information. In addition, in Equation 1, $\alpha$ and $(1-\alpha)$ are respectively weights for the first and second direction information, and $\alpha$ may be suitably determined so that the combined direction information $\theta_{fusion}$ is in accordance with an actual direction of the target. By calculating the direction information as described above, it is possible to obtain direction information in which both drift and noise are reduced.

The time delay correcting unit 220 is a portion for correcting the direction information of the target, calculated by the signal combining unit 210, in consideration of a time difference between an acquisition time of the motion information used for calculating the direction information and a rendering time. Also, in an embodiment, the time delay correcting unit 220 may correct the direction information by further using a time difference between the rendering time and a time when the image is actually displayed at the display unit 40. For this purpose, the time delay correcting unit 220 may acquire information about operation periods from the simulation unit 30 and/or the display unit 40, respectively. Detailed operations of the time delay correcting unit 220 will be described later with reference to FIG. 2.

The simulation unit 30 is a portion for receiving the direction information of the target from the direction calculating unit 20 and simulating a model based thereon. The direction information received by the simulation unit 30 means direction information which is primarily calculated by the signal combining unit 210 and then corrected by the time delay correcting unit 220. The simulation unit 30 allows the model to be simulated according to the motion of the target by updating a location and velocity of each part of the model at each time stage by reflecting the direction information of the target. In addition, the simulation unit 30 renders the simulated model into an image to be displayed on the screen.

The simulation may be performed so that the model replicates a motion of the target, or that the model is changed according to the motion of the target or that the model interacts with the target, without being limited to any specific simulation scheme. In addition, a process for performing computer simulation to a two-dimensional or three-dimensional model by using given conditions is well known to those having ordinary skill in the art, and thus, it is not described in detail here to more clearly show the essence of the present disclosure.

The display unit 40 is a portion for displaying the image rendered by the simulation unit 30 to be observed by a user. For example, the display unit 40 may be a liquid crystal display (LCD), an active-matrix organic light emitting diode (AMOLED) or the like, without being limited thereto. If the simulation apparatus of this embodiment is integrated in a mobile device such as a smartphone, the display unit 40 may be implemented as a touch screen which is a display means and also an input means of the mobile device.

FIG. 2 is a diagram for illustrating time differences among an acquisition time of motion information, a rendering time and an image display time in a simulation method according to an embodiment.

Referring to FIGS. 1 and 2, the sensor unit 10 measures motion information periodically, and a measurement time comes at every first period ($T_1$). In addition, the simulation unit 30 also performs rendering periodically, and a rendering time comes at every second period ($T_2$). The first period ($T_1$) and the second period ($T_2$) may be identical to or different from each other, but each measurement time and each rendering time are asynchronous due to the difference in period or start points. As a result, a time delay ($D_{t1}$) occurs between each measurement time and each rendering time adjacent thereto. If the first period ($T_1$) and the second period ($T_2$) are different from each other, the time delay ($D_{t1}$) is differently set at each time point.

The time delay correcting unit 220 of the direction calculating unit 20 corrects the direction information of the target by using a time delay (Dt1) from the acquisition time of the motion information, used for calculating the direction information, to a following rendering time. In other words, the direction information corrected by the time delay correcting unit 220 corresponds to a direction information at the rendering time predicted in advance. The time delay correcting unit 220 transfers the predicted direction information to the simulation unit 30 so that simulation and rendering are performed according to the predicted direction information. In detail, based on times 501, 502 of FIG. 2, for example, the time delay correcting unit 220 calculates a time delay 503 from a measurement time 501 of motion information, used for calculating current direction information, to a following rendering time 502 most adjacent thereto. Next, the time delay correcting unit 220 calculates an angular velocity of the target by means of motion information obtained at the corresponding measurement time 501, and multiples the calculated angular velocity by a time delay 503 and adds the product to the direction information.

In other words, assuming that direction information before being corrected by the time delay correcting unit 220 is $\theta_{current}$, an angular velocity of the target by recently measured motion information is $\omega$, and a time delay between a measurement time of recent motion information and a following rendering time adjacent thereto is $D_{t1}$, the direction information $\theta_{new}$ corrected by the time delay correcting unit 220 may be calculated according to Equation 2 below.

$$\theta_{new} = \theta_{current} + \omega \times D_{t1} \qquad \text{[Equation 2]}$$

In an embodiment, the time delay correcting unit 220 may correct the direction information by further considering a time delay between the rendering time and a time when the actual image is displayed at the display unit 40. In other words, the corrected direction information corresponds to a direction of the target at the time when the actual image is displayed predicted in advance.

Referring to FIG. 2, the display unit 40 displays the image periodically, and an image display time comes at every third period ($T_3$). At this time, a time delay ($D_{t2}$) occurs between each rendering time and each image display time by the display unit 40, and the time delay correcting unit 220 may correct the direction information by further considering the time delay ($D_{t2}$) in addition to the time delay ($D_{t1}$) between the sensor measurement time and the rendering time described above. In this case, the corrected direction information $\theta_{new}$ corrected by the time delay correcting unit 220 may be calculated according to Equation 3 below.

$$\theta_{new} = \theta_{current} + \omega \times (D_{t1} + D_{t2}) \qquad \text{[Equation 3]}$$

In other words, in the simulation apparatus and method according to the embodiments as described above, the direction information of a target at a rendering time is estimated by considering a time delay between a measurement period of a sensor and a rendering period of an image, or the direction information of the target at an image display time is estimated by further considering a time delay between the rendering period and an image display period in addition to the above. Since simulation and rendering are performed by using the estimated direction information as described above, latency caused by mismatching between the measurement period of the sensor and the simulation or display period may be reduced, and thus a simulation result naturally moving according to a motion of the target may be obtained.

The operations of the simulation apparatus according to the embodiments as described above may be at least partially implemented using a computer program and recorded on a computer-readable recording medium. The computer-readable recording medium may include any kind of storage devices where data readable by a computer is stored. The computer-readable recording medium includes, for example, ROM, RAM, CD-ROM, a magnetic tape, a floppy disk, an optical data storage or the like, and may also be implemented in the form of carrier wave (for example, transmission through Internet). In addition, the computer-readable recording medium may be distributed to computer systems connected through a network so that computer-readable codes may be stored and executed in a distribution way. Also, functional programs, codes and code segments for implementing the embodiments may be easily understood by those skilled in the related art.

While the present disclosure has been made based on the embodiments depicted in the figures, this is just an example, it should be understood that various changes ad modifications can be made thereto by those skilled in the art. However, such modifications should be regarded as falling within the scope of the present disclosure. Therefore, the true scope of the preset disclosure should be defined by the appended claims.

INDUSTRIAL APPLICABILITY

Embodiments are directed to an apparatus and method for simulation and a computer program for the same.

The invention claimed is:

1. An apparatus for simulation, comprising:
a sensor unit configured to acquire motion information of a target by using at least one sensor;
a direction calculating unit configured to calculate direction information of the target by using the motion information; and
a simulation unit configured to simulate a physical object and render into an image on the basis of the direction information received from the direction calculating unit,
wherein the direction calculating unit comprises a time delay correcting unit configured to correct the direction information by using a time difference between an acquisition time of the motion information and a rendering time,
wherein the sensor unit is configured to periodically acquire the motion information,
wherein the simulation unit is configured to periodically render the image,
wherein the time delay correcting unit is configured to calculate a time delay from each acquisition time of the motion information to a following rendering time and correct the direction information by using the time delay, and
wherein the time delay correcting unit is configured to correct the direction information by calculating an angular velocity of the target from the motion information and adding a product of the angular velocity and the time delay to the direction information.

2. The apparatus for simulation according to claim 1,
wherein the direction calculating unit is configured to correct the direction information of the target by further using a time difference between the rendering time and a time when the image is displayed at a display unit.

3. The apparatus for simulation according to claim 2,
wherein the display unit is configured to periodically display the image, and
wherein the time delay correcting unit is configured to correct the direction information by further using a time delay from each rendering time till a following image display time.

4. A method for simulation, comprising:
acquiring, by a simulation apparatus, motion information of a target by using at least one sensor;
calculating, by the simulation apparatus, direction information of the target by using the motion information;
correcting, by the simulation apparatus, the direction information by using a time difference between an acquisition time of the motion information and a rendering time; and
simulating, by the simulation apparatus, a physical object and rendering into an image on the basis of the corrected direction information,
wherein the acquiring of motion information and the rendering of the image are periodically performed,
wherein the correcting of the direction information comprises:
calculating a time delay from each acquisition time of the motion information to a following rendering time; and
correcting the direction information by using the time delay,
wherein the correcting of the direction information by using the time delay comprises:
calculating an angular velocity of the target from the motion information; and
correcting the direction information by adding a product of the angular velocity and the time delay to the direction information.

5. The method for simulation according to claim 4, further comprising:
displaying the image at a display unit,
wherein the correcting of the direction information is performed by further using a time difference between the rendering time and a time when the image is displayed.

6. The method for simulation according to claim 5,
wherein the displaying of the image at a display unit are periodically performed, and
wherein the correcting of the direction information is performed by further using a time delay from each rendering time till a following image display time.

7. A non-transitory computer-readable recording medium containing a computer program product, the computer program product when executed by at least one processor causes the processor to perform steps comprising:
acquiring motion information of a target by using at least one sensor;
calculating direction information of the target by using the motion information;
correcting the direction information by using a time difference between an acquisition time of the motion information and a rendering time; and
simulating a physical object and rendering into an image on the basis of the corrected direction information,
wherein the acquiring of motion information and the rendering of the image are periodically performed,
wherein the correcting of the direction information comprises:
calculating a time delay from each acquisition time of the motion information to a following rendering time; and
correcting the direction information by using the time delay,
wherein the correcting of the direction information by using the time delay comprises:
calculating an angular velocity of the target from the motion information; and
correcting the direction information by adding a product of the angular velocity and the time delay to the direction information.

* * * * *